US012777727B2

(12) United States Patent
Derkacs et al.

(10) Patent No.: US 12,777,727 B2
(45) Date of Patent: Oct. 27, 2026

(54) MULTIJUNCTION SOLAR CELLS

(71) Applicant: SolAero Technologies Corp., Albuquerque, NM (US)

(72) Inventors: Daniel Derkacs, Albuquerque, NM (US); Daniel McGlynn, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 363 days.

(21) Appl. No.: 18/069,942

(22) Filed: Dec. 21, 2022

(65) Prior Publication Data

US 2023/0128590 A1 Apr. 27, 2023

Related U.S. Application Data

(62) Division of application No. 16/927,157, filed on Jul. 13, 2020, now Pat. No. 11,569,404, which is a (Continued)

(51) Int. Cl.
*H10F 10/161* (2025.01)
*H10F 10/142* (2025.01)
(Continued)

(52) U.S. Cl.
CPC ......... *H10F 10/161* (2025.01); *H10F 10/142* (2025.01); *H10F 10/144* (2025.01);
(Continued)

(58) Field of Classification Search
CPC .... H10F 77/488; H10F 77/70; H10F 77/1248; H10F 77/48; H10F 77/935; H10F 10/161;
(Continued)

(56) References Cited

U.S. PATENT DOCUMENTS

| | | | |
|---|---|---|---|
| 4,001,864 | A | 1/1977 | Gibbons |
| 4,255,211 | A | 3/1981 | Fraas |

(Continued)

FOREIGN PATENT DOCUMENTS

| | | |
|---|---|---|
| CN | 103426965 | 12/2013 |
| DE | 10 2012 004 734 | 9/2013 |

(Continued)

OTHER PUBLICATIONS

U.S. Appl. No. 14/660,092, filed Mar. 17, 2015, Cornfeld.

(Continued)

*Primary Examiner* — Uyen M Tran
(74) *Attorney, Agent, or Firm* — Christensen, Fonder, Dardi, Busse; Diane E. Bennett; Peter S. Dardi

(57) ABSTRACT

A multijunction solar cell including an upper first solar subcell having a first band gap and positioned for receiving an incoming light beam; a second solar subcell disposed below and adjacent to and lattice matched with said upper first solar subcell, and having a second band gap smaller than said first band gap; wherein the upper first solar subcell covers less than the entire upper surface of the second solar subcell, leaving an exposed portion of the second solar subcell around the periphery of the multijunction solar sell that lies in the path of the incoming light beam.

21 Claims, 8 Drawing Sheets

Related U.S. Application Data division of application No. 15/837,143, filed on Dec. 11, 2017, now abandoned.

(51) Int. Cl.

| | |
|---|---|
| ***H10F 10/144*** | (2025.01) |
| ***H10F 19/20*** | (2025.01) |
| ***H10F 71/00*** | (2025.01) |
| ***H10F 77/00*** | (2025.01) |
| ***H10F 77/124*** | (2025.01) |
| ***H10F 77/42*** | (2025.01) |
| ***H10F 77/48*** | (2025.01) |
| ***H10F 77/70*** | (2025.01) |

(52) U.S. Cl.
CPC ......... *H10F 19/20* (2025.01); *H10F 71/1272* (2025.01); *H10F 77/1248* (2025.01); *H10F 77/48* (2025.01); *H10F 77/488* (2025.01); *H10F 77/70* (2025.01); *H10F 77/935* (2025.01)

(58) Field of Classification Search
CPC ...... H10F 10/144; H10F 10/142; H10F 19/20; H10F 71/1272
See application file for complete search history.

(56) References Cited

U.S. PATENT DOCUMENTS

| | | | | |
|---|---|---|---|---|
| 4,338,480 | A | 7/1982 | Antypas et al. | |
| 4,612,408 | A | 9/1986 | Moddel et al. | |
| 5,009,719 | A | 4/1991 | Yoshida | |
| 5,019,177 | A | 5/1991 | Wanlass | |
| 5,053,083 | A | 10/1991 | Sinton | |
| 5,217,539 | A | 6/1993 | Fraas et al. | |
| 5,322,572 | A * | 6/1994 | Wanlass | H10F 77/484 136/246 |
| 5,342,453 | A | 8/1994 | Olson | |
| 5,376,185 | A | 12/1994 | Wanlass | |
| 5,479,032 | A | 12/1995 | Forrest et al. | |
| 5,944,913 | A | 8/1999 | Hou et al. | |
| 6,180,432 | B1 | 1/2001 | Freeouf | |
| 6,194,245 | B1 | 2/2001 | Tayanaka | |
| 6,239,354 | B1 | 5/2001 | Wanlass | |
| 6,281,426 | B1 | 8/2001 | Olson et al. | |
| 6,300,557 | B1 | 10/2001 | Wanlass | |
| 6,300,558 | B1 | 10/2001 | Takamoto et al. | |
| 6,340,788 | B1 | 1/2002 | King | |
| 6,482,672 | B1 | 11/2002 | Hoffman et al. | |
| 6,660,928 | B1 | 12/2003 | Patton et al. | |
| 6,951,819 | B2 | 10/2005 | Lies et al. | |
| 7,071,407 | B2 | 7/2006 | Faterni et al. | |
| 7,741,146 | B2 | 6/2010 | Cornfeld et al. | |
| 8,187,907 | B1 * | 5/2012 | Newman | H10F 77/211 257/772 |
| 9,018,521 | B1 | 4/2015 | Cornfeld | |
| 10,541,349 | B1 | 1/2020 | Stan et al. | |
| 2002/0117675 | A1 | 8/2002 | Mascarenhas | |
| 2003/0089392 | A1 | 5/2003 | Rohr | |
| 2003/0145884 | A1 | 8/2003 | King | |
| 2003/0160251 | A1 | 8/2003 | Wanlass | |
| 2003/0164186 | A1 | 9/2003 | Clark et al. | |
| 2004/0065363 | A1 | 4/2004 | Fetzer | |
| 2004/0166681 | A1 | 8/2004 | Lies et al. | |
| 2004/0200523 | A1 | 10/2004 | King et al. | |
| 2005/0247339 | A1 | 11/2005 | Barnham | |
| 2006/0021565 | A1 | 2/2006 | Zahler et al. | |
| 2006/0048811 | A1 * | 3/2006 | Krut | H10F 30/222 136/262 |
| 2006/0144435 | A1 | 7/2006 | Wanlass | |
| 2006/0162728 | A1 | 7/2006 | Wanlass et al. | |
| 2007/0193622 | A1 | 8/2007 | Hironobu | |
| 2007/0218649 | A1 | 9/2007 | Hernandez | |
| 2007/0277873 | A1 | 12/2007 | Cornfeld et al. | |
| 2008/0017240 | A1 | 1/2008 | Goto | |
| 2008/0029151 | A1 | 2/2008 | McGlynn et al. | |
| 2008/0149173 | A1 | 6/2008 | Sharps | |
| 2008/0185038 | A1 | 8/2008 | Sharps | |
| 2008/0237633 | A1 | 10/2008 | Jaeger | |
| 2008/0245409 | A1 | 10/2008 | Varghese et al. | |
| 2009/0038679 | A1 | 2/2009 | Varghese et al. | |
| 2009/0078308 | A1 | 3/2009 | Varghese et al. | |
| 2009/0078309 | A1 | 3/2009 | Cornfeld et al. | |
| 2009/0078310 | A1 | 3/2009 | Stan et al. | |
| 2009/0078311 | A1 | 3/2009 | Stan et al. | |
| 2009/0155952 | A1 | 6/2009 | Stan et al. | |
| 2009/0229658 | A1 | 9/2009 | Stan et al. | |
| 2009/0229662 | A1 | 9/2009 | Stan et al. | |
| 2009/0288703 | A1 | 11/2009 | Stan et al. | |
| 2010/0012174 | A1 | 1/2010 | Varghese et al. | |
| 2010/0031994 | A1 | 2/2010 | Varghese | |
| 2010/0041178 | A1 | 2/2010 | Cornfeld et al. | |
| 2010/0047959 | A1 | 2/2010 | Cornfeld et al. | |
| 2010/0089440 | A1 * | 4/2010 | Gray | H10F 77/1248 136/255 |
| 2010/0093127 | A1 | 4/2010 | Sharps et al. | |
| 2010/0116327 | A1 | 5/2010 | Cornfeld | |
| 2010/0122724 | A1 | 5/2010 | Cornfeld et al. | |
| 2010/0122764 | A1 | 5/2010 | Newman | |
| 2010/0147366 | A1 | 6/2010 | Stan et al. | |
| 2010/0151618 | A1 | 6/2010 | Sharps et al. | |
| 2010/0186804 | A1 | 7/2010 | Cornfeld | |
| 2010/0203730 | A1 | 8/2010 | Cornfeld et al. | |
| 2010/0206365 | A1 | 8/2010 | Chumney et al. | |
| 2010/0229913 | A1 | 9/2010 | Cornfeld | |
| 2010/0229926 | A1 | 9/2010 | Newman et al. | |
| 2010/0229932 | A1 | 9/2010 | Cornfeld et al. | |
| 2010/0229933 | A1 | 9/2010 | Cornfeld | |
| 2010/0233839 | A1 | 9/2010 | Cornfeld et al. | |
| 2010/0248411 | A1 | 9/2010 | Cornfeld et al. | |
| 2010/0282305 | A1 | 11/2010 | Sharps et al. | |
| 2011/0030774 | A1 | 2/2011 | Cornfeld et al. | |
| 2011/0041898 | A1 | 2/2011 | Cornfeld | |
| 2011/0048499 | A1 | 3/2011 | Myong | |
| 2011/0220190 | A1 | 9/2011 | Lee | |
| 2011/0318866 | A1 | 12/2011 | Pan et al. | |
| 2012/0007114 | A1 | 1/2012 | Seo et al. | |
| 2012/0132250 | A1 | 5/2012 | Cornfeld | |
| 2013/0068278 | A1 | 3/2013 | Kataoka | |
| 2013/0118546 | A1 | 5/2013 | Jones-Albertus | |
| 2013/0122638 | A1 * | 5/2013 | Jones-Albertus | H10F 10/144 438/74 |
| 2013/0228216 | A1 | 9/2013 | Cornfeld | |
| 2013/0327378 | A1 | 12/2013 | Patel et al. | |
| 2014/0076401 | A1 | 3/2014 | King | |
| 2014/0102520 | A1 | 4/2014 | Tauke-Pedretti | |
| 2014/0182667 | A1 | 7/2014 | Richards | |
| 2015/0090321 | A1 | 4/2015 | Cho et al. | |
| 2015/0357501 | A1 | 12/2015 | Derkacs et al. | |
| 2015/0380591 | A1 * | 12/2015 | Bett | H10F 10/142 136/255 |
| 2017/0278990 | A1 | 9/2017 | Saltz | |

FOREIGN PATENT DOCUMENTS

| | | |
|---|---|---|
| DE | 20 2012 104 415 | 12/2013 |
| FR | 2 878 076 | 5/2006 |
| WO | WO 2005/015638 | 2/2005 |
| WO | WO 2013/074530 | 5/2013 |
| WO | WO 2013/132073 | 9/2013 |
| WO | WO 2015/135623 | 9/2015 |

OTHER PUBLICATIONS

Aiken et al., "Consideration of High Bandgap Subcells for Advanced Multijunction Solar Cells," Conference Record of the 2006 IEEE 4th World Conference on Photovoltaic Energy Conversion, 2006:838-841.

Batop Optoelectronics, "Energy band gap Eg of lnxGa1-xAs alloys" http://www.batop.de/information/Eg_InGaAs.html#, assessed May 16, 2015, 1 pg.

(56) References Cited

OTHER PUBLICATIONS

Brown et al., "Results of the Telestar Radiation Experiments," Bell System Technical Journal, 42, 1505-1559, 1963.
Campesato "High Efficiency Alingap and Alingaas Solar Cells For 32% Four Junction Devices" 28th European Photovoltaic Solar Energy Conference and Exhibition, 2013, DOI: 10.4229/28thEUPVSEC2013-1BO.12.2,63-68.
Campesato "High Efficiency Solar Cells Based on AllnGaP" 34th IEEE Photovoltaic Specialists Conference (PVSC)) 2009, 001112-001117.
Chang "Influence of indium doping on AIGaAs layers grown by molecular beam epitaxy" Applied Physics Letters 57, 1640 (1990); doi: 10.1063/1.104073 (Year: 1990).
Cornfeld et al., "Advances in the Performance of Inverted Metamorphic Multi-Junction Solar Cells," 23rd European Photovoltaic Energy Conference, Aug. 29, 2008, Valencia, Spain; 11 pgs.
Cornfeld et al., "Development of a Large Area Inverted Metamorphic Multi-Junction (IMM) Highly Efficient AMO Solar Cell," 33rd IEEE Photovoltaic Specialists Conference May 11-16, 2008, San Diego, CA, USA; 5 pgs.
Cornfeld et al., "Development of a Large Area Inverted Metamorphic Multi-Junction Highly Efficient AMO Solar Cell," Conference paper presented at the 33rd IEEE Photovoltaic Specialists Conference (May 11-16, 2008) on May 12, 2008. San Diego, CA, USA; 17 pgs.
Dimroth et al., "Thin 5-Junction Solar Cells with Improved Radiation Hardness," Conference Record of the 2006 IEEE 4th World Conference on Photovoltaic Energy Conversion, May 2006; pp. 1777-1780.
European Search Report for EP Patent Application No. 18151083.5, Jun. 22, 2018, 10 pages.
Friendman et al., "0.7-eV GalnAs Junction for a GalnP/GaAs/GalnAs(leV)/GalnAs(0.7eV) Four-Junction Solar Cell" 2006 IEEE 4th World Conference on Photovoltaic Energy Conversion, May 7-12, 2006, Waikoloa, Hawaii, USA; 598-602.
Geisz et al., "High Efficiency GalnP/GaAs/InGaAs triple-junction solar cells grown inverted with a metamorphic bottom junction," Applied Physics Letters, 2007; 91:023502-1-023502-3.
Geisz et al., "Inverted GalnP / (ln)GaAs Triple-Junction Solar Cells with Low-Stress Metamorphic Bottom Junctions," 33rd IEEE Photovoltaic Specialists Conference, May 11-16, 2008, San Diego, CA, USA; 5 pgs.
King "Band gap-voltage offset and energy production in next-generation multijunction solar cells" Prog. Photovolt: Res. Appl. 2011; 19:797-812, 2011.
King et al., "High-Efficiency Space and Terrestrial Multijunction Solar Cells Through Bandgap Control in Cell Structures," 2002 Photovoltaic Specialists Conference, Conference Record of the 29th IEEE, May 19-24, 2002, New Orleans, LA, USA; pp. 776-781.
King et al., "Next-Generation, High Efficiency 111-V Multijunction Solar Cells," 28th IEEE Photovoltaic Specialists Conference, Sep. 15-22, 2000, Anchorage, AK, USA; pp. 998-1001.
King et al., "Solar Cell Generations Over 40% Efficiency," 26th European Photovoltaic Solar Energy Conference and Exhibition, Sep. 5, 2011, Hamburg, Germany; 15 pgs.
Koh et al., "Fabrication of Superconducting Delay Line with GaAs Schottky Diode," IEEE Transactions on Applied Superconductivity 1999; 9(2):3224-3227.
Law et al., "Future Technology Pathways of Terrestrial 111-V Multijunction Solar Cells for Concentrator Photovoltaic Systems," Solar Energy Materials and Solar Cells, 2010; 94:1314-1318.
Lewis et al., "Recent Developments in Multijunction Solar Cell Research," Solar Cells, 1988; 24:171-183.
Lewis et al., "The Crystallographic Connection of MOCVD-Grown Monolithic Cascade Subcells Via Transparent Graded Layers." Journal of Crystal Growth, 1984; 69:515-526.
Patel et al., "Experimental Results From Performance Improvement and Radiation Hardening of Inverted Metamorphic Multijunction Solar Cells," IEEE Journal of Photovoltaics, Jul. 2012; 2(3):377-381.
Schultz et al., "High Efficiency 1.0-eV GalnAs Bottom Solar Cell for 3-Junction Monolithic Stack," IEEE, 1990: 148-152.
Sexl et al., "MBE Growth of Metamorphic In(Ga)AIAs Buffers," 1997 IEEE International Symposium on Compound Semiconductors, Sep. 8-11, 1997; pp. 49-52.
Sharps et al., "Inverted the triple junction improves efficiency and flexibility." Compound Semiconductor, Oct. 2007; pp. 25-28.
Sinharoy et al., "Progress in the Development of Metamorphic Multi-Junction 111-V Space Solar Cells," Progress in Photovoltaics: Research and Applications, Feb. 2002; 10:427-432.
Stan et al., "Recent Advances in the Performance of Multi-Junction Space Solar Cells," 22nd European Photovoltaic Solar Energy Conference, Sep. 3-7, 2007, Milan, Italy; pp. 101-105.
Stan et al., "Very High Efficiency Triple Junction Solar Cells by MOVPE," 14th International Conference of Metalorganic Vapor Phase Epitaxy, Jun. 5, 2008, Metz, France; 32 pgs.
Tada et al., Solar Cell Radiation Handbook, Third Edition, JPL Publication 82-69, 1982; cover page, face page, and Table of Contents; 7 pages.
Takamoto et al., "InGaP/GaAs-based Multijunction Solar Cells," Progress in Photovoltaics: Research and Applications, 2005; 13:495-511.
Venkatasubramanian et al., "An Inverted-Growth Approach to Development of an IR-Transparent, High-Efficiency AIGaAs/GaAs Cascade Solar Cell," 22nd IEEE Photovoltaic Specialists Conference, Oct. 7-11, 1991, Las Vegas, NV USA; pp. 93-98.
Voncken et al., "Strain-accelerated HF etching of AIAs for epitaxial lift-off," J. Phys.: Condens. Matter, 2004; 16:3585-3596.
Walters et al., "Space Radiation Effects in Advanced Solar Cell Materials and Devices," Mat. Res. Soc. Symp. Proc., 2002; 692:569-580.
Wanlass et al., "Lattice Mismatched Approaches for High-Performance, 111-V Photovoltaic Energy Converters," Conference Proceedings of the 31st IEEE Photovoltaic Specialists Conference and Exhibition, Lake Buena Vista, FL, USA; Jan. 3-7, 2005; 530-535.
Wanlass et al., "Monolithic, Ultra-Thin GalnP/GaAs/GalnAs Tandem Solar Cells," 2006 IEEE 4th World Conference on Photovoltaic Energy Conversion, May 7-12, 2006, Waikoloa, Hawaii, USA; 729-732.
Yablonovitch et al., "Extreme selectivity in the lift-off of epitaxial GaAs films," Appl. Phys. Lett., 1987; 51(28): 2222-2224.
Yamaguchi, "Physics and Technologies of Superhigh-Efficiency Tandem Solar Cells," Semiconductors, Sep. 1999, 33(9):961-964.
Yamaguchi, "Radiation Resistance of compound Semiconductor Solar Cells," J. Appl. Physics, 1995; 78:1476-1480.
Yoon et al., "Progress of Inverted Metamorphic 111-V Solar Cell Development at Spectrolab," 33rd IEEE Specialists Conference, May 11-16, 2008, San Diego, CA, USA; 6 pages.

* cited by examiner

MULTIJUNCTION SOLAR CELLS

REFERENCE TO RELATED APPLICATIONS

This application is a divisional of U.S. patent application Ser. No. 16/927,157 filed Jul. 13, 2020, now U.S. Pat. No. 11,569,404 which was a divisional of U.S. patent application Ser. No. 15/837,143 filed Dec. 11, 2017.

This application is also related to U.S. patent application Ser. No. 15/213,594, filed Jul. 19, 2016; Ser. No. 15/250,643 filed Aug. 29, 2016; and Ser. No. 15/283,598 filed Oct. 3, 2016.

All of the above related applications are incorporated herein by reference in their entirety.

BACKGROUND OF THE INVENTION

Field of the Invention

The present disclosure relates to solar cells and the fabrication of solar cells, and more particularly to the design and specification of lattice matched multijunction solar cells adapted for space missions.

Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology. Compared to silicon, III-V compound semiconductor multijunction devices have greater energy conversion efficiencies and generally more radiation resistance, although they tend to be more complex to properly specify and manufacture. Typical commercial III-V compound semiconductor multijunction solar cells have energy efficiencies that exceed 29.5% under one sun, air mass 0 (AM0) illumination, whereas even the most efficient silicon technologies generally reach only about 18% efficiency under comparable conditions. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads use increasing amounts of power as they become more sophisticated, and missions and applications anticipated for five, ten, twenty or more years, the power-to-weight ratio and lifetime efficiency of a solar cell becomes increasingly more important, and there is increasing interest not only the amount of power provided at initial deployment, but over the entire service life of the satellite system, or in terms of a design specification, the amount of power provided at the "end of life" (EOL) which is affected by the radiation exposure of the solar cell over time in a space environment.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, with each subcell being designed for photons in a specific wavelength band. After passing through a subcell, the photons that are not absorbed and converted to electrical energy propagate to the next subcells, where such photons are intended to be captured and converted to electrical energy.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current needed by the payload or subcomponents of the payload, the amount of electrical storage capacity (batteries) on the spacecraft, and the power demands of the payloads during different orbital configurations.

A solar cell designed for use in a space vehicle (such as a satellite, space station, or an interplanetary mission vehicle), has a sequence of subcells with compositions and band gaps which have been optimized to achieve maximum energy conversion efficiency for the AM0 solar spectrum in space. The AM0 solar spectrum in space is notably different from the AM1.5 solar spectrum at the surface of the earth, and accordingly terrestrial solar cells are designed with subcell band gaps optimized for the AM1.5 solar spectrum.

There are substantially more rigorous qualification and acceptance testing protocols used in the manufacture of space solar cells to ensure that space solar cells can operate satisfactorily at the wide range of temperatures and temperature cycles encountered in space. These testing protocols include (i) high-temperature thermal vacuum bake-out; (ii) thermal cycling in vacuum (TVAC) or ambient pressure nitrogen atmosphere (APTC); and in some applications (iii) exposure to radiation equivalent to that which would be experienced in the space mission, and measuring the current and voltage produced by the cell and deriving cell performance data.

As used in this disclosure and claims, the term "space-qualified" shall mean that the electronic component (i.e., the solar cell) provides satisfactory operation under the high temperature and thermal cycling test protocols. The exemplary conditions for vacuum bake-out testing include exposure to a temperature of +100° C. to +135° C. (e.g., about +100° C., +110° C., +120° C., +125° C., +135° C.) for 2 hours to 24 hours, 48 hours, 72 hours, or 96 hours; and exemplary conditions for TVAC and/or APTC testing that include cycling between temperature extremes of −180° C. (e.g., about −180° C., −175° C., −170° C., −165° C., −150° C., −140° C., −128° C., −110° C., −100° C., −75° C., or −70° C.) to +145° C. (e.g., about +70° C., +80° C., +90° C., +100° C., +110° C., +120° C., +130° C., +135° C., or +145° C.) for 600 to 32,000 cycles (e.g., about 600, 700, 1500, 2000, 4000, 5000, 7500, 22000, 25000, or 32000 cycles), and in some space missions up to +180° C. See, for example, Fatemi et al., "Qualification and Production of Emcore ZTJ Solar Panels for Space Missions," Photovoltaic Specialists Conference (PVSC), 2013 IEEE 39th (DOI: 10. 1109/PVSC 2013 6745052). Such rigorous testing and qualifications are not generally applicable to terrestrial solar cells and solar cell arrays.

Conventionally, such measurements are made for the AM0 spectrum for "one-sun" illumination, but for PV systems which use optical concentration elements, such measurements may be made under concentrations of 2×, 100×, or 1000× or more.

The space solar cells and arrays experience a variety of complex environments in space missions, including the vastly different illumination levels and temperatures seen during normal earth orbiting missions, as well as even more challenging environments for deep space missions, operating at different distances from the sun, such as at 0.7, 1.0 and 3.0 AU (AU meaning astronomical units). The photovoltaic arrays also endure anomalous events from space environmental conditions, and unforeseen environmental interactions during exploration missions. Hence, electron and proton radiation exposure, collisions with space debris, and/or normal aging in the photovoltaic array and other systems could cause suboptimal operating conditions that degrade the overall power system performance, and may result in failures of one or more solar cells or array strings and consequent loss of power.

A further distinctive difference between space solar cell arrays and terrestrial solar cell arrays is that a space solar cell array utilizes welding and not soldering to provide robust electrical interconnections between the solar cells, while terrestrial solar cell arrays typically utilize solder for electrical interconnections. Welding is required in space solar cell arrays to provide the very robust electrical connections that can withstand the wide temperature ranges and temperature cycles encountered in space such as from −175° C. to +180° C. In contrast, solder joints are typically sufficient to survive the rather narrow temperature ranges (e.g., about −40° C. to about +50° C.) encountered with terrestrial solar cell arrays.

A further distinctive difference between space solar cell arrays and terrestrial solar cell arrays is that a space solar cell array utilizes silver-plated metal material for interconnection members, while terrestrial solar cells typically utilize copper wire for interconnects. In some embodiments, the interconnection member can be, for example, a metal plate. Useful metals include, for example, molybdenum; a nickel-cobalt ferrous alloy material designed to be compatible with the thermal expansion characteristics of borosilicate glass such as that available under the trade designation KOVAR from Carpenter Technology Corporation; a nickel iron alloy material having a uniquely low coefficient of thermal expansion available under the trade designation Invar, FeNi36, or 64FeNi; or the like.

An additional distinctive difference between space solar cell arrays and terrestrial solar cell arrays is that space solar cell arrays typically utilize an aluminum honeycomb panel for a substrate or mounting platform. In some embodiments, the aluminum honeycomb panel may include a carbon composite face sheet adjoining the solar cell array. In some embodiments, the face sheet may have a coefficient of thermal expansion (CTE) that substantially matches the CTE of the bottom germanium (Ge) layer of the solar cell that is attached to the face sheet. Substantially matching the CTE of the face sheet with the CTE of the Ge layer of the solar cell can enable the array to withstand the wide temperature ranges encountered in space without the solar cells cracking, delaminating, or experiencing other defects. Such precautions are generally unnecessary in terrestrial applications.

Thus, a further distinctive difference of a space solar cell from a terrestrial solar cell is that the space solar cell must include a cover glass over the semiconductor device to provide radiation resistant shielding from particles in the space environment which could damage the semiconductor material. The cover glass is typically a ceria doped borosilicate glass which is typically from three to six mils in thickness and attached by a transparent adhesive to the solar cell.

In summary, it is evident that the differences in design, materials, and configurations between a space-qualified III-V compound semiconductor solar cell and subassemblies and arrays of such solar cells, on the one hand, and silicon solar cells or other photovoltaic devices used in terrestrial applications, on the other hand, are so substantial that prior teachings associated with silicon or other terrestrial photovoltaic system are simply unsuitable and have no applicability to the design configuration of space-qualified solar cells and arrays. Indeed, the design and configuration of components adapted for terrestrial use with its modest temperature ranges and cycle times often teach away from the highly demanding design requirements for space-qualified solar cells and arrays and their associated components.

The assembly of individual solar cells together with electrical interconnects and the cover glass form a so-called "CIC" (Cell-Interconnected-Cover glass) assembly, which are then typically electrically connected to form an array of series-connected solar cells. The solar cells used in many arrays often have a substantial size; for example, in the case of the single standard substantially "square" solar cell trimmed from a 100 mm wafer with cropped corners, the solar cell can have a side length of seven cm or more.

The radiation hardness of a solar cell is defined as how well the cell performs after exposure to the electron or proton particle radiation which is a characteristic of the space environment. A standard metric is the ratio of the end of life performance (or efficiency) divided by the beginning of life performance (EOL/BOL) of the solar cell. The EOL performance is the cell performance parameter after exposure of that test solar cell to a given fluence of electrons or protons (which may be different for different space missions or orbits). The BOL performance is the performance parameter prior to exposure to the particle radiation.

Charged particles in space could lead to damage to solar cell structures, and in some cases, dangerously high voltage being established across individual devices or conductors in the solar array. These large voltages can lead to catastrophic electrostatic discharging (ESD) events. Traditionally for ESD protection the backside of a solar array may be painted with a conductive coating layer to ground the array to the space plasma, or one may use a honeycomb patterned metal panel which mounts the solar cells and incidentally protects the solar cells from backside radiation.

The radiation hardness of the semiconductor material of the solar cell itself is primarily dependent on a solar cell's minority carrier diffusion length ($_{Lmin}$) in the base region of the solar cell (the term "base" region referring to the p-type base semiconductor region disposed directly adjacent to an n-type "emitter" semiconductor region, the boundary of which establishes the p-n photovoltaic junction). The less degraded the parameter $L_{min}$ is after exposure to particle radiation, the less the solar cell performance will be reduced. A number of strategies have been used to either improve $L_{min}$, or make the solar cell less sensitive to $L_{min}$ reductions. Improving $L_{min}$ has largely involved including a gradation in dopant elements in the semiconductor base layer of the subcells so as to create an electric field to direct minority carriers to the junction of the subcell, thereby effectively increasing $L_{min}$. The effectively longer $L_{min}$ will improve the cell performance, even after the particle radiation exposure. Making the cell less sensitive to $L_{min}$ reductions has involved increasing the optical absorption of the base layer such that thinner layers of the base can be used to absorb the same amount of incoming optical radiation.

Another consideration in connection with the manufacture of space solar cell arrays is that conventionally, solar cells have been arranged on a support and interconnected using a substantial amount of manual labor. For example, first individual CICs are produced with each interconnect individually welded to the solar cell, and each cover glass individually mounted. Then, these CICs are connected in series to form strings, generally in a substantially manual manner, including the welding steps from CIC to CIC. Then, these strings are applied to a panel substrate and electrically interconnected in a process that includes the application of adhesive, wiring, etc. All of this has traditionally been carried out in a manual and substantially artisanal manner.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as the effect of its exposure to radiation in the ambient environment over time. The identification and specification of such design parameters is a non-trivial engineering undertaking, and would vary depending upon the specific space mission and customer design requirements. Since the power output is a function of both the voltage and the current produced by a subcell, a simplistic view may seek to maximize both parameters in a subcell by increasing a constituent element, or the doping level, to achieve that effect. However, in reality, changing a material parameter that increases the voltage may result in a decrease in current, and therefore a lower power output. Such material design parameters are interdependent and interact in complex and often unpredictable ways, and for that reason are not "result effective" variables that those skilled in the art confronted with complex design specifications and practical operational considerations can easily adjust to optimize performance.

Moreover, the current (or more precisely, the short circuit current density $J_{sc}$) and the voltage (or more precisely, the open circuit voltage $V_{oc}$) are not the only factors that determine the power output of a solar cell. In addition to the power being a function of the short circuit density ($J_{sc}$), and the open circuit voltage ($V_{oc}$), the output power is actually computed as the product of $V_{oc}$ and $J_{sc}$, and a Fill Factor (FF). As might be anticipated, the Fill Factor parameter is not a constant, but in fact may vary at a value between 0.5 and somewhat over 0.85 for different arrangements of elemental compositions, subcell thickness, and the dopant level and profile. Although the various electrical contributions to the Fill Factor such as series resistance, shunt resistance, and ideality (a measure of how closely the semiconductor diode follows the ideal diode equation) may be theoretically understood, from a practical perspective the actual Fill Factor of a given subcell cannot always be predicted, and the effect of making an incremental change in composition or band gap of a layer may have unanticipated consequences and effects on the solar subcell semiconductor material, and therefore an unrecognized or unappreciated effect on the Fill Factor. Stated another way, an attempt to maximize power by varying a composition of a subcell layer to increase the $V_{oc}$ or $J_{sc}$ or both of that subcell, may in fact not result in high power, since although the product $V_{oc}$ and $J_{sc}$ may increase, the FF may decrease and the resulting power also decrease. Thus, the $V_{oc}$ and $J_{sc}$ parameters, either alone or in combination, are not necessarily "result effective" variables that those skilled in the art confronted with complex design specifications and practical operational considerations can easily adjust to optimize performance.

Furthermore, the fact that the short circuit current density ($J_{sc}$), the open circuit voltage ($V_{oc}$), and the fill factor (FF), are affected by the slightest change in such design variables, the purity or quality of the chemical pre-cursors, or the specific process flow and fabrication equipment used, and such considerations further complicates the proper specification of design parameters and predicting the efficiency of a proposed design which may appear "on paper" to be advantageous.

It must be further emphasized that in addition to process and equipment variability, the "fine tuning" of minute changes in the composition, band gaps, thickness, and doping of every layer in the arrangement has critical effect on electrical properties such as the open circuit voltage ($V_{oc}$) and ultimately on the power output and efficiency of the solar cell.

To illustrate the practical effect, consider a design change that results in a small change in the $V_{oc}$ of an active layer in the amount of 0.01 volts, for example changing the $V_{oc}$ from 2.72 to 2.73 volts. Assuming all else is equal and does not change, such a relatively small incremental increase in voltage would typically result in an increase of solar cell efficiency from 29.73% to 29.84% for a triple junction solar cell, which would be regarded as a substantial and significant improvement that would justify implementation of such design change.

For a single junction GaAs subcell in a triple junction device, a change in $V_{oc}$ from 1.00 to 1.01 volts (everything else being the same) would increase the efficiency of that junction from 10.29% to 10.39%, about a 1% relative increase. If it were a single junction stand-alone solar cell, the efficiency would go from 20.58% to 20.78%, still about a 1% relative improvement in efficiency.

Present day commercial production processes are able to define and establish band gap values of epitaxially deposited layers as precisely as 0.01 eV, so such "fine tuning" of compositions and consequential open circuit voltage results are well within the range of operational production specifications for commercial products.

Another important mechanical or structural consideration in the choice of semiconductor layers for a solar cell is the desirability of the adjacent layers of semiconductor materials in the solar cell, i.e. each layer of crystalline semiconductor material that is deposited and grown to form a solar subcell, have similar or substantially similar crystal lattice constants or parameters.

Here again there are trade-offs between including specific elements in the composition of a layer which may result in improved voltage associated with such subcell and therefore potentially a greater power output, and deviation from exact crystal lattice matching with adjoining layers as a consequence of including such elements in the layer which may result in a higher probability of defects, and therefore lower manufacturing yield.

In that connection, it should be noted that there is no strict definition of what is understood to mean two adjacent layers are "lattice matched" or "lattice mismatched". For purposes in this disclosure, "lattice mismatched" refers to two adjacently disposed materials or layers (with thicknesses of greater than 100 nm) having in-plane lattice constants of the materials in their fully relaxed state differing from one another by less than 0.02% in lattice constant. (Applicant notes that this definition is considerably more stringent than that proposed, for example, in U.S. Pat. No. 8,962,993, which suggests less than 0.6% lattice constant difference as defining "lattice mismatched" layers).

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads use increasing amounts of power as they become more sophisticated, and missions and applications anticipated for five, ten, twenty or more years, the power-to-weight ratio and lifetime efficiency of a solar cell becomes increasingly more important, and there is increasing interest not only the amount of power provided at initial deployment, but over the entire service life of the satellite system, or in terms of a design specification, the amount of power provided at the "end of life" (EOL) which is affected by the radiation exposure of the solar cell over time in a space environment.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, with each subcell being designed for photons in a specific wavelength band. After passing through a subcell, the photons that are not absorbed and converted to electrical energy propagate to the next subcells, where such photons are intended to be captured and converted to electrical energy.

The energy conversion efficiency of multijunction solar cells is affected by such factors as the number of subcells, the thickness of each subcell, the composition and doping of each active layer in a subcell, and the consequential band structure, electron energy levels, conduction, and absorption of each subcell, as well as the effect of its exposure to radiation in the ambient environment over time. The identification and specification of such design parameters is a non-trivial engineering undertaking, and would vary depending upon the specific space mission and customer design requirements. Since the power output is a function of both the voltage and the current produced by a subcell, a simplistic view may seek to maximize both parameters in a subcell by increasing a constituent element, or the doping level, to achieve that effect. However, in reality, changing a material parameter that increases the voltage may result in a decrease in current, and therefore a lower power output. Such material design parameters are interdependent and interact in complex and often unpredictable ways, and for that reason are not "result effective" variables that those skilled in the art confronted with complex design specifications and practical operational considerations can easily adjust to optimize performance. Electrical properties such as the short circuit current density ($J_{sc}$), the open circuit voltage ($V_{oc}$), and the fill factor (FF), which determine the efficiency and power output of the solar cell, are affected by the slightest change in such design variables, and as noted above, to further complicate the calculus, such variables and resulting properties also vary, in a non-uniform manner, over time (i.e. during the operational life of the system) due to exposure to radiation during space missions.

Another important mechanical or structural consideration in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters.

SUMMARY OF THE DISCLOSURE

Objects of the Disclosure

It is an object of the present disclosure to provide increased photoconversion efficiency in a multijunction solar cell for space applications by implementing two optically parallel adjacent subcells in a multijunction solar cell.

It is another object of the present disclosure to increase the current collection in the second subcell (directly beneath the top subcell) by eliminating and removing the top subcell over a portion of the surface area of the solar cell.

It is another object of the present disclosure to provide a multijunction solar cell in which the top subcell current is increased per unit area to enable a greater amount of power output from the solar cell at end-of-life (EOL).

It is another object of the present invention to match the current in the top subcell with the current in the second subcell not at beginning-of-life (BOL) but at end-of-life (EOL).

Some implementations of the present disclosure may incorporate or implement fewer of the aspects and features noted in the foregoing objects.

Features of the Invention

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.0 to 2.0, or 1.3 to 1.4, or 1.5 to 1.9 eV.

Briefly, and in general terms, the present disclosure provides a multijunction solar cell comprising: an upper first solar subcell having a first band gap and positioned for receiving an incoming light beam; a second solar subcell disposed below and adjacent to and lattice matched with said upper first solar subcell, and having a second band gap smaller than said first band gap; wherein the upper first solar subcell covers less than the entire upper surface of the second solar subcell, leaving an exposed portion of the surface of the second solar subcell that lies in the path of the incoming light beam.

In some embodiments, there further comprises a lateral conduction layer disposed between the upper first solar subcell and the second solar subcell.

In some embodiments, there further comprises grid lines disposed over the upper first solar subcell, and wherein the portion comprises a plurality of discrete spaced apart regions disposed between the grid lines disposed over the surface of the upper first solar subcell.

In some embodiments, the upper first subcell is composed of indium gallium aluminum phosphide having a band gap in the range of 2.0 to 2.2 eV; the second solar subcell includes an emitter layer composed of indium gallium phosphide or aluminum gallium arsenide, and a base layer composed of aluminum gallium arsenide and having a band gap in the range of 1.6 to 1.8 eV; and further comprising a third solar subcell disposed below the second solar subcell; and a fourth solar subcell disposed below the third solar subcell.

In some embodiments, there further comprises a distributed Bragg reflector (DBR) structure disposed below the second solar subcell and above the third solar subcell, wherein the DBR structure includes a first DBR layer composed of a plurality of n type or p type $Al_xGa_{1-x}As$ layers, and a second DBR layer disposed over the first DBR layer and composed of a plurality of n or p type $Al_yGa_{1-y}As$ layers, where 0<x<1, 0<y<1, and y is greater than x.

In another aspect, the present disclosure provides a multijunction solar cell, comprising a first subcell that initially receives incident light upon said solar cell, said first subcell being made of a first material system having a band gap in the range of 1.85 to 1.95 eV, a first thickness, and producing a first photogenerated current density output; a second subcell having a first portion that receives said incident light after said first subcell receives said incident light, and a second portion that receives said incident light directly, said second subcell being disposed immediately adjacent said first subcell, being made of said first material system, having a band gap in the range of 1.3 to 1.42 eV, a second thickness that is greater than said first thickness, and producing a second photogenerated current density output that is substantially equal in amount to said first photogenerated current density output; and a third bottom subcell that is disposed in said solar cell such that said third bottom subcell is disposed below the second subcell, said third subcell having a third photogenerated current density output that is equal to or greater than said first photogenerated current density output.

In some embodiments, there further comprises a lateral conduction layer disposed between the second and the third subcells and composed of gallium arsenide (GaAs) or gallium indium phosphide (GaInP).

In some embodiments, there further comprises a bottom subcell that is disposed in said cell such that said bottom subcell is disposed below the third subcell and is the last of the subcells to receive said incident light, said bottom subcell having a bottom photogenerated current output that is greater than said first photogenerated current output.

In some embodiments, the thickness of the first subcell is between 600 nm and 1200 nm.

In some embodiments, the EOL to BOL ratio of the short circuit current of the second subcell is greater than 95%.

In some embodiments, the short circuit current density in the first subcell over the first portion is approximately equal to the short circuit density of the second subcell.

In some embodiments, the upper first subcell is composed of indium gallium aluminum phosphide; and the second solar subcell includes an emitter layer composed of indium gallium phosphide or aluminum gallium arsenide, and a base layer composed of aluminum gallium arsenide.

In some embodiments, a lateral conduction layer is disposed between the upper first solar subcell and the second solar subcell.

In some embodiments, the exposed portion of the second subcell constitutes between 5% and 10% of the surface area of the solar cell.

In some embodiments, the exposed portion comprises a plurality of parallel spaced apart strips extending across the width of the solar cell.

In some embodiments, there further comprises grid lines disposed over the upper first solar subcell, and wherein the strips constituting the exposed portion of the second subcell are disposed between alternating grid lines.

In some embodiments, the exposed portion comprises a peripheral region of the solar cell.

In some embodiments, the exposed portion comprises a plurality of irregularly shaped regions extending over the surface of the solar cell.

In some embodiments, the irregularly shaped regions form and comprise alphanumeric characters.

In some embodiments, the alphanumeric characters represent a unique serial number associated with the respective solar cell.

In some embodiments, the exposed portion comprises a plurality of discrete spaced apart regions disposed between the grid lines which are disposed over the surface of the upper first solar subcell.

In some embodiments, the upper first subcell is composed of an active region of indium aluminum phosphide; the second solar subcell includes an emitter layer composed of indium gallium phosphide or aluminum gallium arsenide, and a base layer composed of indium gallium arsenide; and further comprising a third solar subcell composed of germanium disposed below the second solar subcell.

In some embodiments, there further comprises a distributed Bragg reflector (DBR) structure disposed below the second solar subcell and above the third solar subcell, wherein the DBR structure includes a first DBR layer composed of a plurality of n type or p type $Al_xGa_{1-x}As$ layers, and a second DBR layer disposed over the first DBR layer and composed of a plurality of n or p type $Al_yGa_{1-y}As$ layers, where 0<x<1, 0<y<1, and y is greater than x.

In some embodiments, the distributed Bragg reflector (DBR) structure is disposed adjacent to and between the middle and bottom solar subcells and arranged so that light can enter and pass through the middle solar subcell and at least a portion of which can be reflected back into the middle and upper solar subcell and out of the solar cell by the DBR structure.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The present disclosure will be better and more fully appreciated by reference to the following detailed description when considered in conjunction with the accompanying drawings, wherein.

GLOSSARY OF TERMS

Figure 1A:
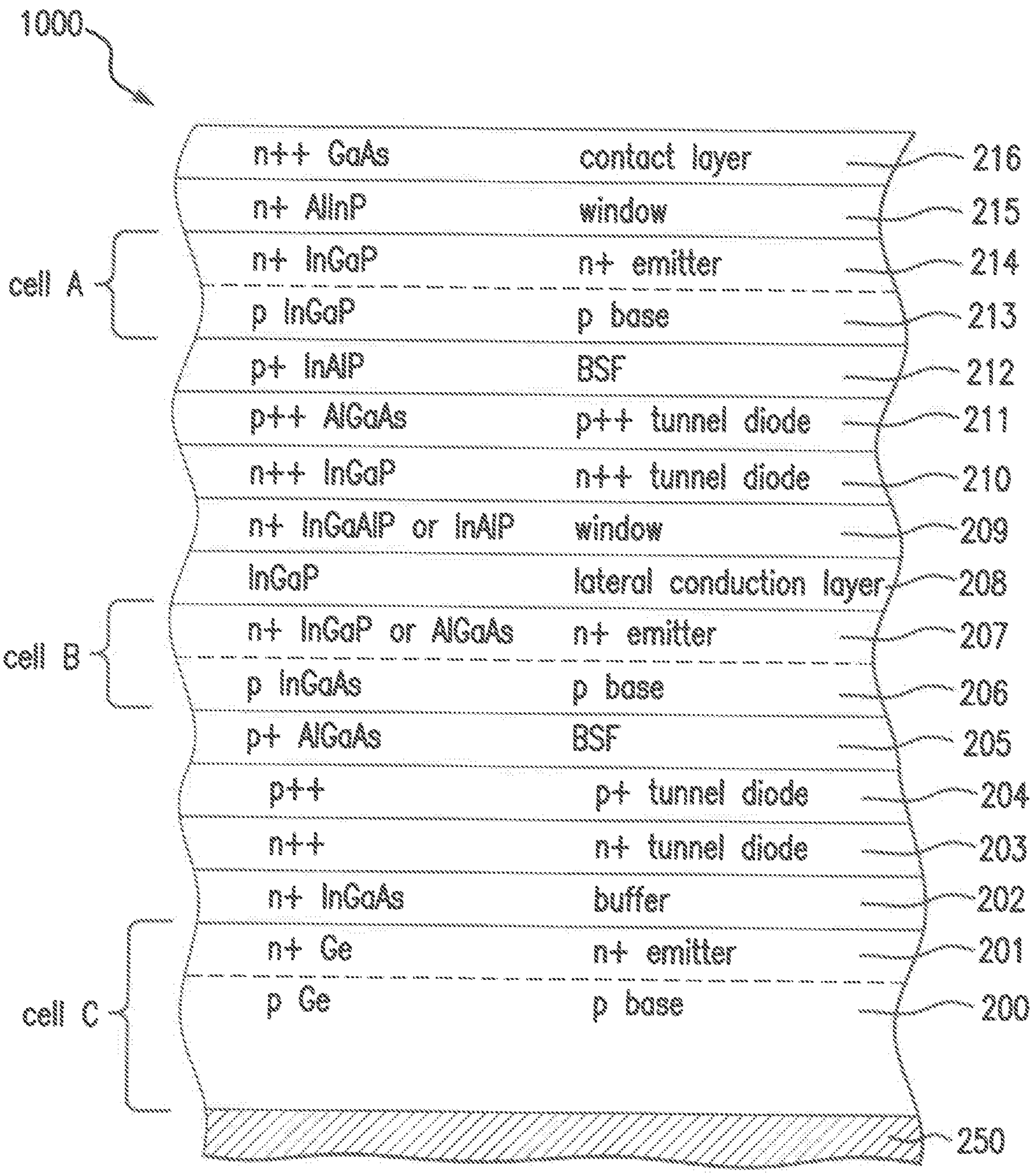
FIG. 1A is a cross-sectional view of a three junction solar cell after several stages of fabrication including the deposition of certain semiconductor layers on the growth substrate, according to a first embodiment of the present disclosure.

"III-V compound semiconductor" refers to a compound semiconductor formed using at least one elements from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Band gap" refers to an energy difference (e.g., in electron volts (eV)) separating the top of the valence band and the bottom of the conduction band of a semiconductor material.

"Beginning of Life (BOL)" refers to the time at which a photovoltaic power system is initially deployed in operation.

"Bottom subcell" refers to the subcell in a multijunction solar cell which is furthest from the primary light source for the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by less than 0.02% in lattice constant. (Applicant expressly adopts this definition for the purpose of this disclosure, and notes that this definition is considerably more stringent than that proposed, for example, in U.S. Pat. No. 8,962,993, which suggests less than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Short circuit current ($I_{sc}$)" refers to the amount of electrical current through a solar cell or solar subcell when the voltage across the solar cell is zero volts, as represented and measured, for example, in units of milliamps.

"Short circuit current density"—see "current density".

"Solar cell" refers to an electronic device operable to convert the energy of light directly into electricity by the photovoltaic effect.

"Solar cell assembly" refers to two or more solar cell subassemblies interconnected electrically with one another.

"Solar cell subassembly" refers to a stacked sequence of layers including one or more solar subcells.

"Solar subcell" refers to a stacked sequence of layers including a p-n photoactive junction composed of semiconductor materials. A solar subcell is designed to convert photons over different spectral or wavelength bands to electrical current.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"ZTJ" refers to the product designation of a commercially available SolAero Technologies Corp. triple junction solar cell.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells (as well as inverted metamorphic multijunction solar cells) are disclosed in the related applications noted above. Some, many or all of such features may be included in the structures and processes associated with the lattice matched or "upright" solar cells of the present disclosure. However, more particularly, the present disclosure is directed to the fabrication of a multijunction lattice matched solar cell with etched-out or cut-away regions in which a top portion of the top subcell is eliminated or removed.

Prior to discussing the specific embodiments of the present disclosure, a brief discussion of some of the issues associated with the design of multijunction solar cells, and the context of the composition or deposition of various specific layers in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and direction and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a single "result effective variable" that one skilled in the art can simply specify and incrementally adjust to a particular level and thereby increase the power output and efficiency of a solar cell.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

The efficiency of a solar cell is not a simple linear algebraic equation as a function of the amount of gallium or aluminum or other element in a particular layer. The growth of each of the epitaxial layers of a solar cell in a reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

More specifically, the present disclosure intends to provide a relatively simple and reproducible technique that does not employ inverted processing associated with inverted metamorphic multijunction solar cells, and is suitable for use in a high volume production environment in which various semiconductor layers are grown on a growth substrate in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

The lattice constants and electrical properties of the layers in the semiconductor structure are preferably controlled by specification of appropriate reactor growth temperatures and times, and by use of appropriate chemical composition and dopants. The use of a deposition method, such as Molecular Beam Epitaxy (MBE), Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type, and are within the scope of the present disclosure.

The present disclosure is in one embodiment directed to a growth process using a metal organic chemical vapor deposition (MOCVD) process in a standard, commercially available reactor suitable for high volume production. Other embodiments may use other growth technique, such as MBE. More particularly, regardless of the growth technique, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

Some comments about MOCVD processes used in one embodiment are in order here.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1A illustrates a particular example of an embodiment of a three junction solar cell 1000 after several stages of fabrication including the growth of certain semiconductor layers on the growth substrate up to the contact layer 216 as provided by the present disclosure.

As shown in the illustrated example of FIG. 1A, the bottom subcell C includes a substrate 200 formed of p-type germanium ("Ge") which also serves as a base layer. A back metal contact pad 250 formed on the bottom of base layer 200 provides electrical contact to the multijunction solar cell 1000. The bottom subcell C, further includes, for example, a highly doped n-type Ge emitter layer 201, and an n-type indium gallium arsenide ("InGaAs") nucleation layer 302. The nucleation layer is deposited over the base layer, and the emitter layer is formed in the substrate by diffusion of deposits into the Ge substrate, thereby forming the n-type Ge layer 301. Heavily doped p-type aluminum gallium arsenide ("AlGaAs") and heavily doped n-type gallium arsenide ("GaAs") tunneling junction layers 203, 204 may be deposited over the nucleation layer to provide a low resistance pathway between the bottom and middle subcells.

In the illustrated example of FIG. 1A, the subcell B includes a highly doped p-type aluminum gallium arsenide ("AlGaAs") back surface field ("BSF") layer 205, a p-type InGaAs base layer 206, a highly doped n-type indium gallium phosphide ("InGaP") or AlGaAs emitter layer 207 and a n-type indium gallium phosphide ("InGaP") lateral conduction layer 208. Other compositions may be used as well.

The window layer 209 of InGaAlP or InAlP is formed over layer 208 and helps reduce the recombination loss and improves passivation of the cell surface of the underlying junctions.

Before depositing the layers of the top cell A, heavily doped n-type InGaP and p-type InGaP and AlGaAs tunneling junction layers 210, 211 may be deposited over the subcell B.

In the illustrated example, the top subcell A includes a highly doped p-type indium aluminum phosphide ("$InAlP_2$") BSF layer 212, a p-type InGaAlP base layer 213, a highly doped n-type InGaAlP emitter layer 214 and a highly doped n-type $InAlP_2$ window layer 215.

A cap or contact layer 216 of GaAs is deposited over the window layer 215.

Figure 1B:
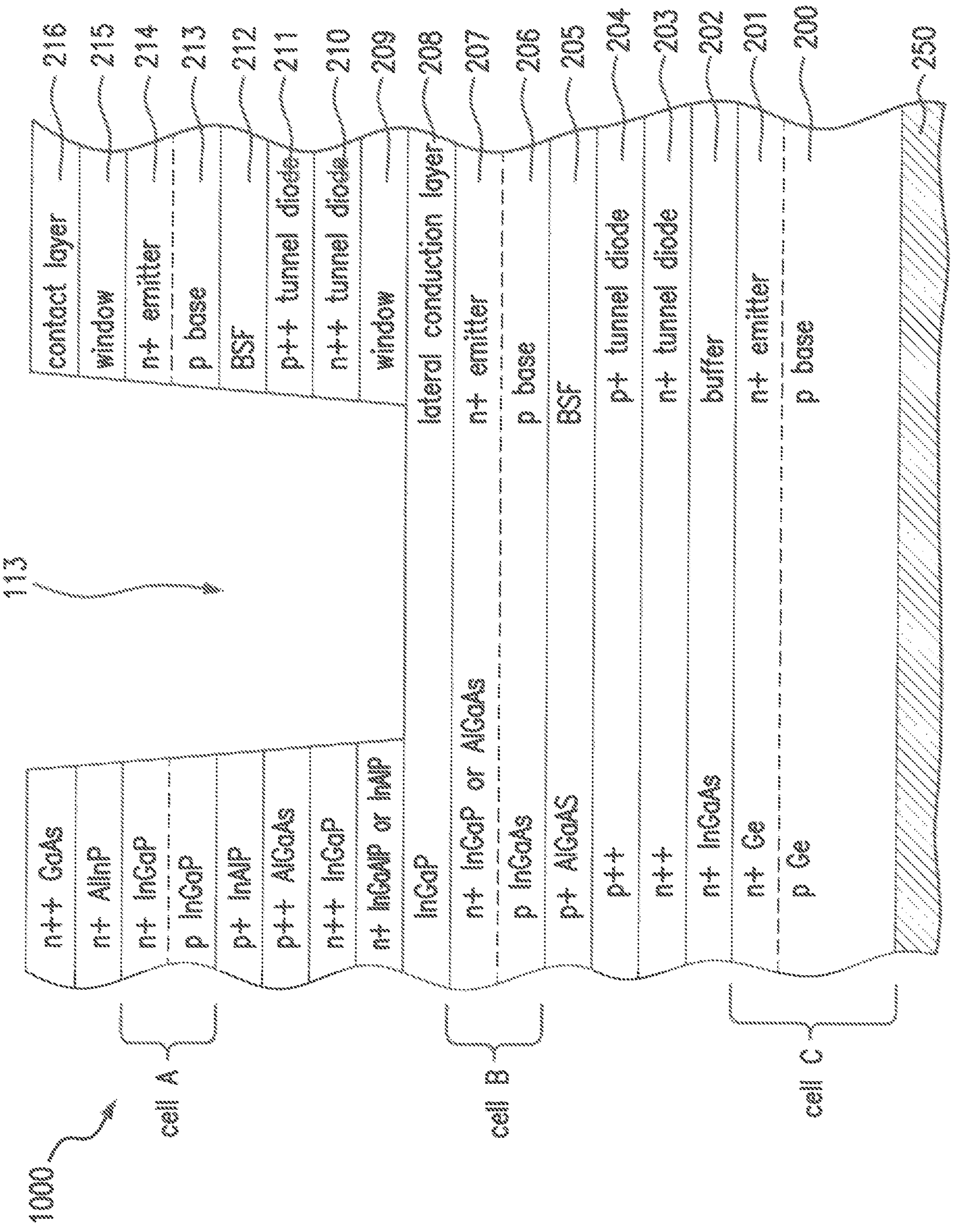
FIG. 1B is a cross-sectional view of the three junction solar cell of FIG. 1A after the next stage of fabrication including the removal of the top subcell in one or more regions of the solar cell.

FIG. 1B is a cross-sectional view of the three junction solar cell of FIG. 1A after the next stage of fabrication including the removal of the top subcell in one or more regions 113 of the solar cell down to the top surface of the window layer 209. A suitable etchant solution may be selected and utilized so that the etching process will stop at the lateral conduction layer 208, or other etch-stop layer (not shown) depending upon the particular composition of the layers of the solar cell.

Figure 1C:
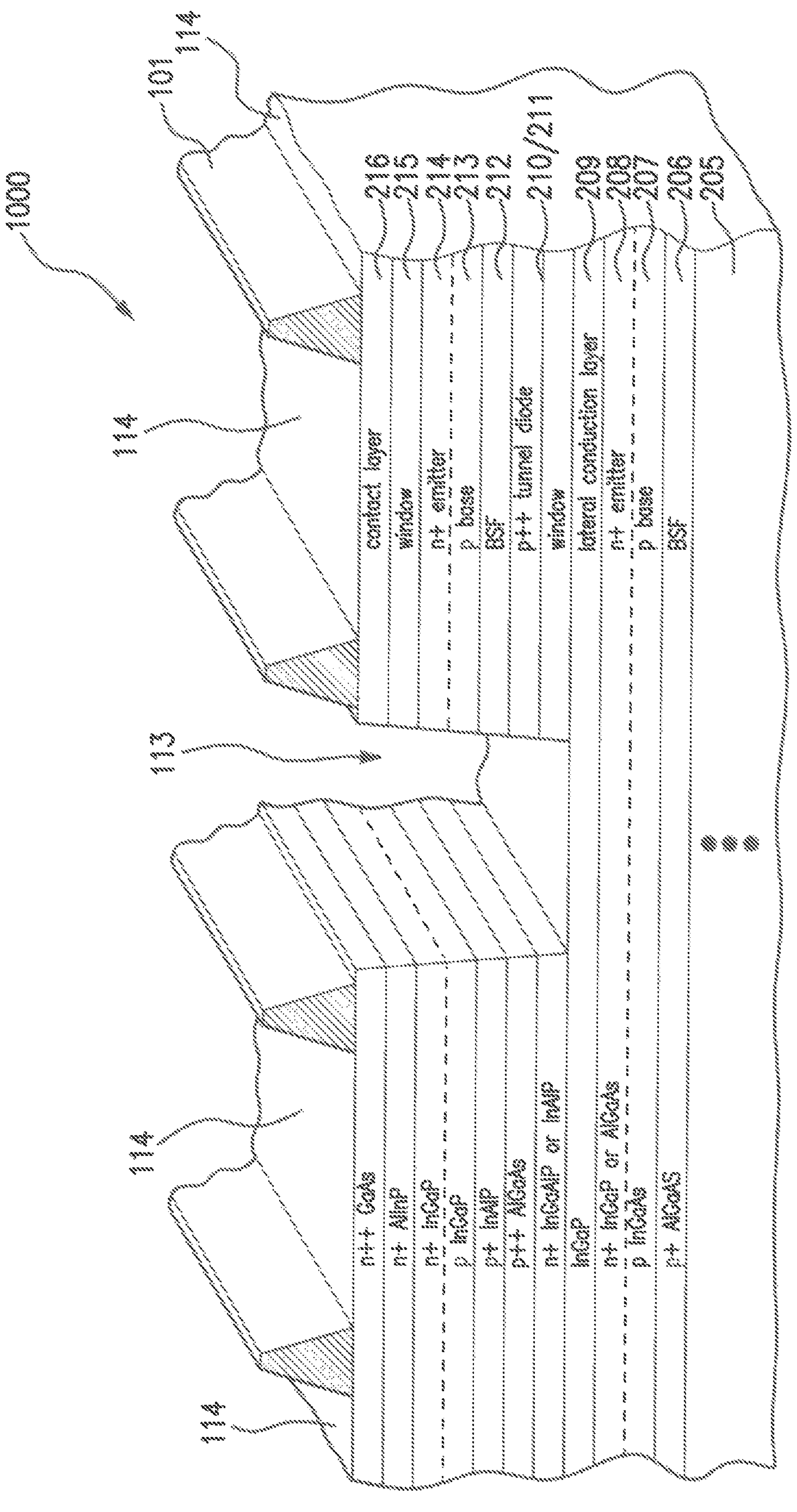
FIG. 1C is a cross-sectional view of the three junction solar cell of FIG. 1A after the next stage of fabrication including the formation of grid lines over the solar cell.
Figure 2:
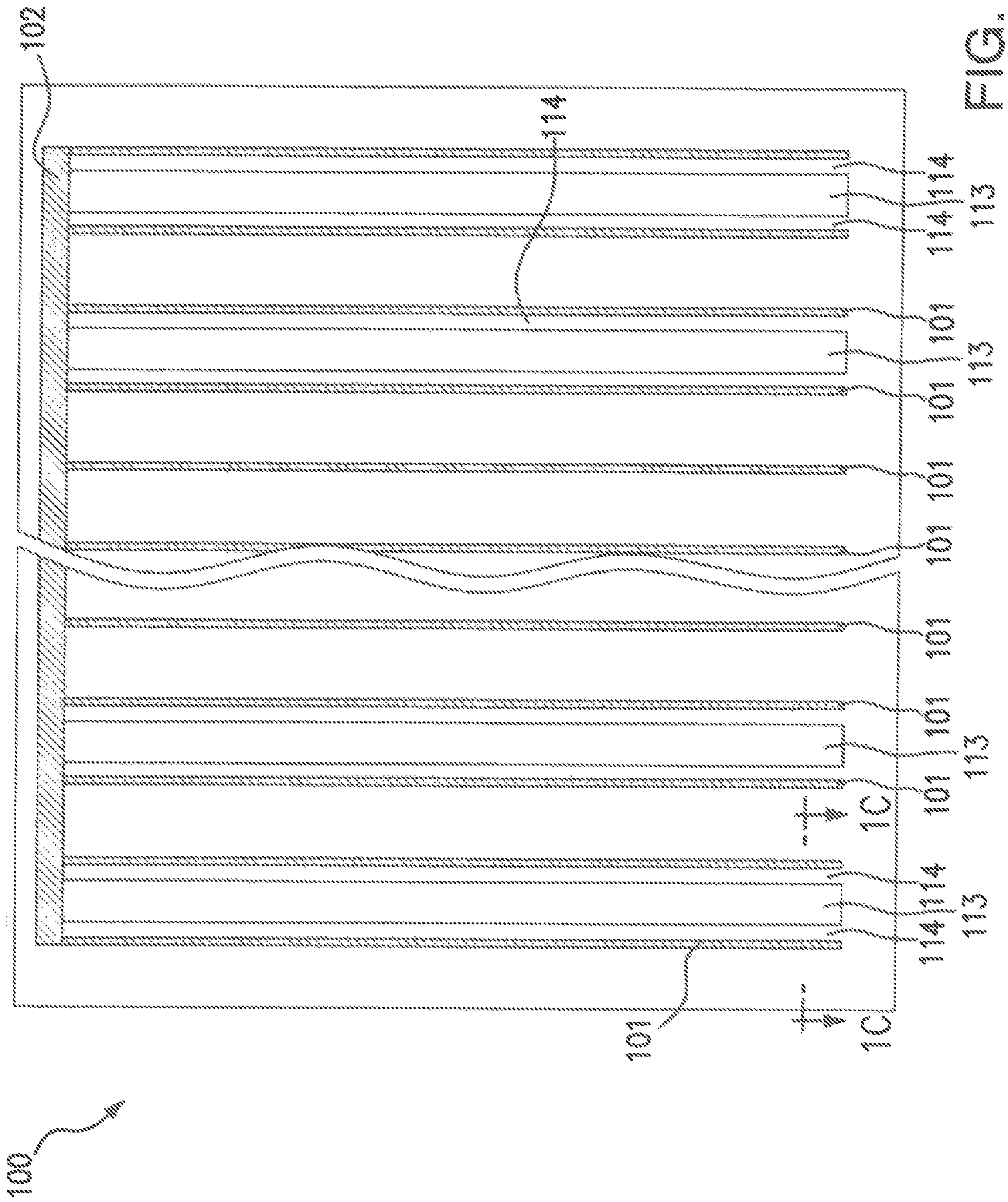
FIG. 2 is a top plan view of the solar cell of FIG. 1A in a first embodiment according to the present disclosure.

FIG. 1C is a cross-sectional view of the three junction solar cell of FIG. 1A shown through the 1C-1C plane in FIG. 2, after the next stage of fabrication including the formation of the grid lines 101 over the solar cell's contact layer 114.

FIG. 2 is a top plan view of the solar cell of FIG. 1A in a first embodiment 100 according to the present disclosure.

In this FIG. 2 embodiment, the regions 113 are strips extending along the length of the solar cell between four pairs of grid lines 114. In this illustrated example, the regions 113 are disposed between the two leftmost pairs of grid lines 101 and the two rightmost pairs of gridlines 101.

Figure 3:
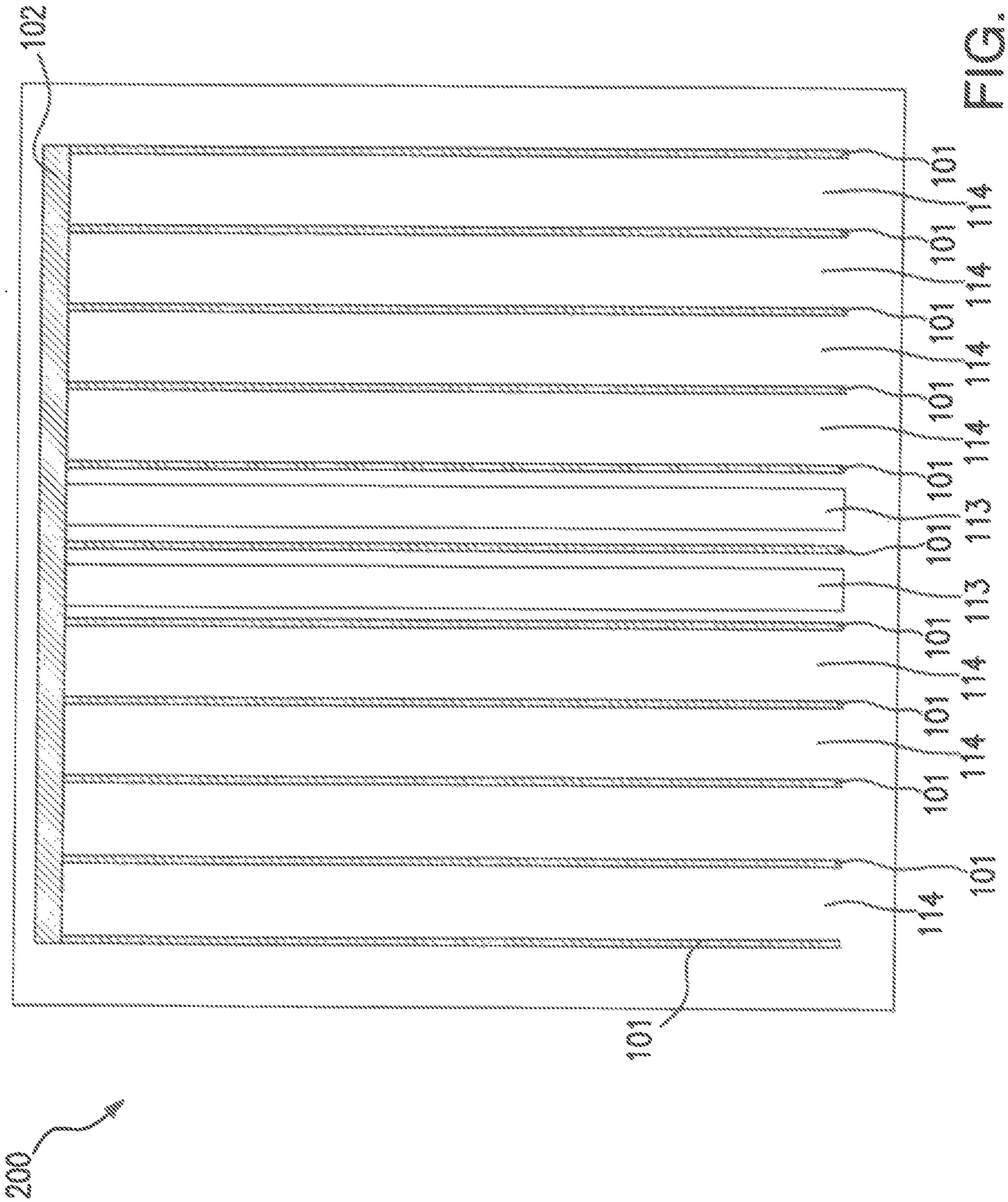
FIG. 3 is a top plan view of the solar cell of FIG. 1A in a second embodiment according to the present disclosure.

FIG. 3 is a top plan view of the solar cell of FIG. 1A in a second embodiment 300 according to the present disclosure.

In this FIG. 3 embodiment, the regions 113 are strips extending along the length of the solar cell between four pairs of grid lines 101. In this illustrated example, the regions 113 are disposed between the two center pairs of grid lines 101.

Figure 4:
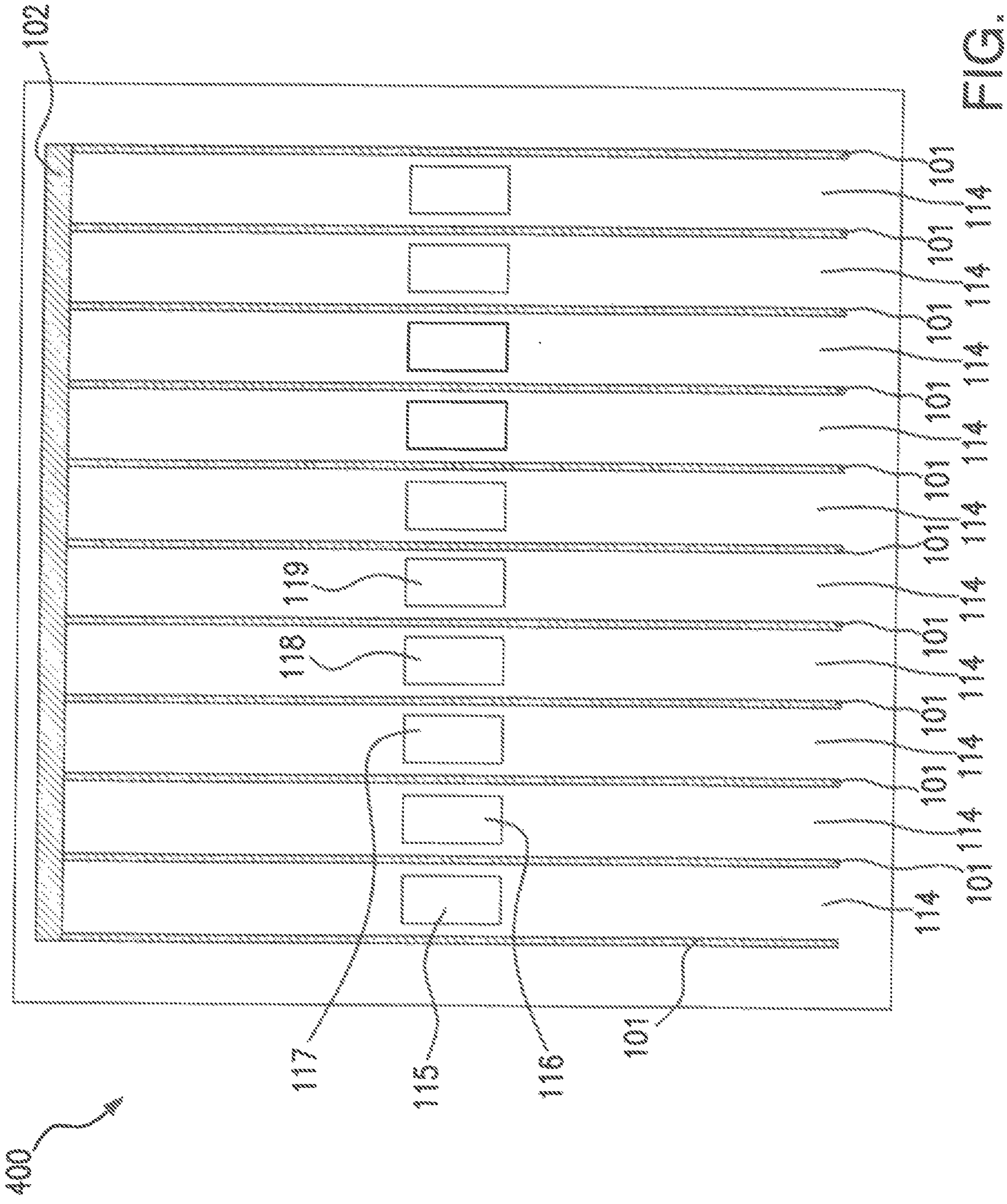
FIG. 4 is a top plan view of the solar cell of FIG. 1A in a third embodiment according to the present disclosure.

FIG. 4 is a top plan view of the solar cell of FIG. 1A in a third embodiment 400 according to the present disclosure.

In this FIG. 4 embodiment, the regions 115, 116, 117, 118, 119 . . . (corresponding to the cut-away region 113 in earlier Figures) are rectangular regions extending from the left hand side of the solar cell to the right hand side, and disposed between the pairs of the grid lines 101. The rectangular regions 115, 116, . . . in one embodiment have a length approximately twice that of its width.

Figure 5:
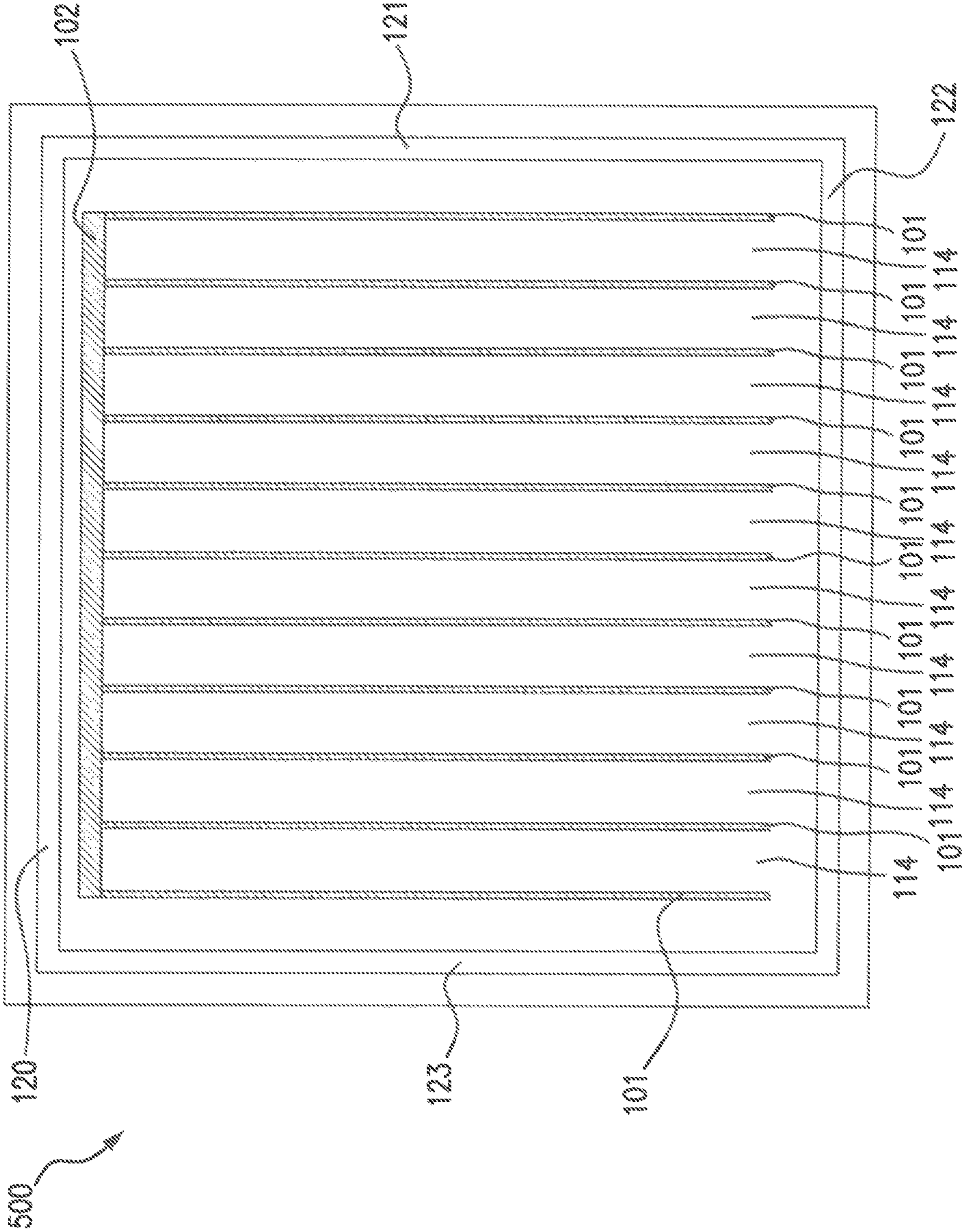
FIG. 5 is a top plan view of the solar cell of FIG. 1A in a fourth embodiment according to the present disclosure.

FIG. 5 is a top plan view of the solar cell of FIG. 1A in a fourth embodiment 500 according to the present disclosure.

In this FIG. 5 embodiment, the regions 120, 121, 122, and 123 (corresponding to the cut-away regions 113 in earlier Figures) are a rectangularly shaped peripheral regions disposed along the edges of the solar cell.

Figure 6:
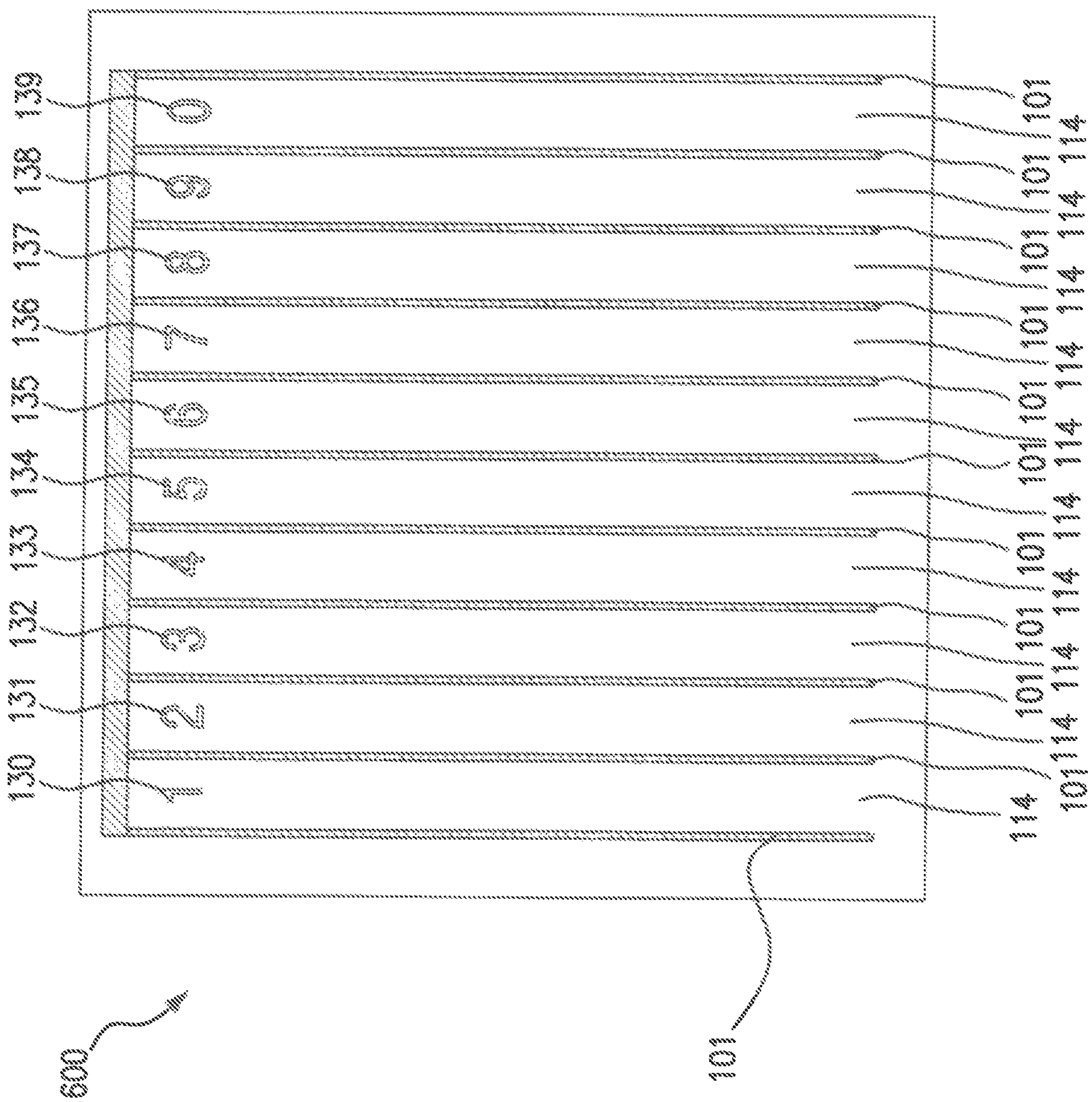
FIG. 6 is a top plan view of the solar cell of FIG. 1A in a fifth embodiment according to the present disclosure.

FIG. 6 is a top plan view of the solar cell of FIG. 1A in a fifth embodiment 600 according to the present disclosure.

In the FIG. 6 embodiment, the regions 130, 131, . . . 139 (corresponding to the cut-away regions 113 in earlier Figures) are shaped regions disposed between grid lines 101 possibly throughout the surface of the solar cell 600. In the depicted embodiment, the shaped regions are numerals which could constitute a module number or serial number of the solar cell 600. In other embodiments, the shaped regions may be pictorial designs, logos, bar codes, or other types of graphical representations The overall current produced by the multijunction cell solar cell may be raised by increasing the current produced by top subcell. Additional current can be produced by top subcell by increasing the thickness of the p-type InGaAlP2 base layer in that cell. The increase in thickness allows additional photons to be absorbed, which results in additional current generation. Preferably, for space or AM0 applications, the increase in thickness of the top subcell maintains the approximately 4 to 5% difference in current generation between the top subcell A and middle subcell C. For AM1 or terrestrial applications, the current generation of the top cell and the middle cell may be chosen to be equalized.

It will be understood that each of the elements described above, or two or more together, also may find a useful application in other types of structures or constructions differing from the types of structures or constructions described above.

Although described embodiments of the present disclosure utilizes a vertical stack of three subcells, various aspects and features of the present disclosure can apply to stacks with fewer or greater number of subcells, i.e. two junction cells, three junction cells, five, six, seven junction cells, etc.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell 309, with p-type and n-type InGaP is one example of a homojunction subcell.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A multijunction solar cell comprising:

(i) a tandem vertical stack comprising an upper solar subcell comprising a first surface having a first surface area, a second solar subcell comprising a second surface having a second surface area, and a bottom solar subcell;

(ii) a highly doped lateral conduction layer disposed directly above the second solar subcell and covered totally the second surface of the second solar subcell;

(iii) a plurality of openings in the upper solar subcell extending to the highly doped lateral conduction layer so that a portion of the high doped lateral conduction layer and a portion of the second solar subcell are exposed to the incident light through such openings, wherein the plurality of openings have a collective surface area in a plane parallel to the second surface; and (iv) a plurality of grid lines disposed over the upper solar subcell but not over the second solar subcell, such that no interconnections or contacts are present in the openings in the upper solar subcell;

wherein the collective surface area is between 5 and 10 percent of the second surface area and wherein the thickness of the upper solar subcell is designed such that at the beginning-of-life current collection in the upper solar subcell is greater than the current collection in the second solar subcell, thereby increasing the overall power output of the multijunction cell at the end-of-life.

2. The multijunction solar cell as defined in claim 1, wherein the first surface has a continuous periphery and the plurality of openings in the upper solar subcell are disposed along the continuous periphery.

3. The multijunction solar cell as defined in claim 1, wherein the plurality of openings comprise a plurality of substantially rectangular strips.

4. The multijunction solar cell as defined in claim 3, wherein each strip is substantially parallel to each of the respective sides of the multijunction solar cell.

5. The multijunction solar cell as defined in claim 2, wherein the multijunction solar cell is substantially rectangular and the openings comprise four continually connected regions disposed along each side of the multijunction solar cell.

6. The multijunction solar cell as defined in claim 1, further comprising a distributed Bragg reflector (DBR) structure disposed below the second solar subcell and above the third solar subcell, wherein the DBR structure includes a first DBR layer composed of a plurality of n type or p type $Al_xGa_{1-x}As$ layers, and a second DBR layer disposed over the first DBR layer and composed of a plurality of n or p type $Al_yGa_{1-y}As$ layers, where $0<x<1$, $0<y<1$, and y is greater than x.

7. The multijunction solar cell as defined in claim 1, wherein the highly doped lateral conduction layer is composed of gallium arsenide (GaAs) or gallium indium phosphide (GaInP).

8. The multijunction solar cell as defined in claim 1, wherein the thickness of the upper solar subcell is between 600 nm and 1200 nm.

9. The multijunction solar cell as defined in claim 1, wherein the EOL to BOL ratio of the short circuit current of the second solar subcell is greater than 95%.

10. The multijunction solar cell as defined in claim 1, wherein the short circuit current density in the upper solar subcell is equalized to the short circuit density of the second subcell.

11. The multijunction solar cell as defined in claim 1, wherein the upper solar subcell is composed of indium gallium aluminum phosphide; and the second solar subcell includes an emitter layer composed of indium gallium phosphide or aluminum gallium arsenide, and a base layer composed of aluminum gallium arsenide.

12. The multijunction solar cell as defined in claim 1, wherein the upper solar subcell has a band gap in the range of 2.0 to 2.2 eV; the second solar subcell has a band gap in the range of 1.6 to 1.8 eV;

and further comprising a fourth solar subcell disposed below the third solar subcell and above the bottom solar subcell.

13. The multijunction solar cell as defined in claim 1, wherein the upper solar subcell has a band gap in the range of 1.85 to 1.95 eV and a first thickness, and the second solar subcell has a band gap in the range of 1.3 to 1.42 eV and a second thickness different than the first thickness.

14. The multijunction solar cell as defined in claim 1, wherein the current collection in the upper solar subcell is designed to match with the current collection in the second solar subcell at the end-of-life (EOL).

15. The multijunction solar cell as defined in claim 1, wherein the plurality of openings constitute a plurality of discrete spaced-apart openings.

16. The multijunction solar cell as defined in claim 1, wherein the plurality of openings is constituted by a plurality of continuously connected regions.

17. The multijunction solar cell as defined in claim 1, wherein the plurality of openings completely surround the plurality of grid lines.

18. The multijunction solar cell as defined in claim 1, wherein one or more of the plurality of openings are constituted by substantially rectangular strips which are arranged substantially parallel to the plurality of grid lines.

19. A method of fabricating a multijunction solar cell comprising:

(i) forming a tandem vertical stack comprising an upper solar subcell comprising a first surface having a first surface area, a second solar subcell comprising a second surface having a second surface area, and a bottom solar subcell;

(ii) forming a highly doped lateral conduction layer disposed directly above the second solar subcell and covered totally the second surface of the second solar subcell;

(iii) forming a plurality of openings in the upper solar subcell extending to the highly doped lateral conduction layer so that a portion of the high doped lateral conduction layer and a portion of the second solar subcell are exposed to the incident light through such openings, wherein the plurality of openings have a collective surface area in a plane parallel to the second surface; and (iv) forming a plurality of grid lines disposed over the upper solar subcell but not over the second solar subcell, such that no interconnections or contacts are present in the openings in the upper solar subcell;

wherein the collective surface area is between 5 and 10 percent of the second surface area and wherein the thickness of the upper solar subcell is designed such that at the beginning-of-life current collection in the upper solar subcell is greater than the current collection in the second solar subcell, thereby increasing the overall power output of the multijunction cell at the end-of-life.

20. The multijunction solar cell as defined in claim 1, wherein the second surface area is different from the first surface area.

21. The multijunction solar cell as defined in claim 1, wherein the current collection in the upper solar subcell is about 4% to about 5% greater than the current collection in the second solar subcell.

* * * * *